United States Patent
Zhao et al.

(10) Patent No.: US 11,609,705 B2
(45) Date of Patent: Mar. 21, 2023

(54) MEMORY DETECTION METHOD AND DETECTION APPARATUS

(71) Applicant: CHANGXIN MEMORY TECHNOLOGIES, INC., Hefei (CN)

(72) Inventors: Zhe Zhao, Hefei (CN); Longjie Sun, Hefei (CN); Lung Yang, Hefei (CN); Yung-Shiuan Chen, Hefei (CN); Lanping Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 38 days.

(21) Appl. No.: 17/451,175

(22) Filed: Oct. 18, 2021

(65) Prior Publication Data

US 2022/0308788 A1 Sep. 29, 2022

Related U.S. Application Data

(63) Continuation of application No. PCT/CN2021/113439, filed on Aug. 19, 2021.

(30) Foreign Application Priority Data

Mar. 23, 2021 (CN) .......................... 202110310429.0

(51) Int. Cl.
*G06F 3/06* (2006.01)

(52) U.S. Cl.
CPC .......... *G06F 3/0655* (2013.01); *G06F 3/0625* (2013.01); *G06F 3/0673* (2013.01)

(58) Field of Classification Search
CPC .... G06F 3/0625; G06F 3/0655; G06F 3/0673; G11C 2029/1202; G11C 2029/1204;
(Continued)

(56) References Cited

U.S. PATENT DOCUMENTS

| 2009/0016126 A1 | 1/2009 | Teramoto et al. |
| 2012/0151299 A1 | 6/2012 | Suh |

FOREIGN PATENT DOCUMENTS

| CN | 1664959 A | 9/2005 |
| CN | 1794357 A | 6/2006 |

(Continued)

OTHER PUBLICATIONS

Corresponding International Patent Application No. PCT/CN2021/113439, International Search Report dated Dec. 7, 2021.

*Primary Examiner* — Hashem Farrokh
(74) *Attorney, Agent, or Firm* — Cooper Legal Group, LLC

(57) ABSTRACT

Embodiments of the present disclosure provide a memory detection method and detection apparatus, for detecting a current-leakage bitline. The method includes: a memory including a plurality of memory cells, a plurality of sense amplifiers, and the sense amplifier including a power line providing a low potential voltage and a power line providing a high potential voltage; writing first memory data to each of the memory cells; performing a reading operation after the first memory data is written; acquiring a first test result based on a difference between first real data and the first memory data; performing the reading operation again to read second real data in each of the memory cells; acquiring a second test result based on a difference between the second real data and second memory data; and acquiring a specific position of the current-leakage bitline based on the second test result and the first test result.

18 Claims, 3 Drawing Sheets

(58) Field of Classification Search
CPC . G11C 29/025; G11C 29/04; G11C 29/12005; G11C 29/12015
USPC ......................................................... 711/154
See application file for complete search history.

(56) References Cited

FOREIGN PATENT DOCUMENTS

| | | | |
|---|---|---|---|
| CN | 102426858 | A | 4/2012 |
| CN | 102810335 | A | 12/2012 |
| CN | 111161785 | A | 5/2020 |
| CN | 112289367 | A | 1/2021 |
| CN | 113012745 | A | 6/2021 |

MEMORY DETECTION METHOD AND DETECTION APPARATUS

This disclosure is a continuation of International Patent Application No. PCT/CN2021/113439, filed on Aug. 19, 2021, which claims priority to Chinese Patent Application No. 202110310429.0, filed with the Chinese Patent Office on Mar. 23, 2021 and entitled "MEMORY DETECTION METHOD AND DETECTION APPARATUS." International Patent Application No. PCT/CN2021/113439 and Chinese Patent Application No. 202110310429.0 are incorporated herein by reference in their entireties.

TECHNICAL FIELD

Embodiments of the present disclosure relate to a memory detection method and detection apparatus.

BACKGROUND

A Dynamic Random Access Memory (DRAM) is a semiconductor memory device commonly used in computers, and consists of a plurality of repeated memory cells. Each memory cell generally includes a capacitor and a transistor. The transistor has a gate connected to a wordline, a drain connected to a bitline and a source connected to the capacitor. A voltage signal on the wordline can control ON or OFF of the transistor so that data information stored in the capacitor can be read through the bitline or data information is written to the capacitor for storage through the bitline.

As the DRAM has an increasingly-advanced manufacturing process and increasingly-high memory density, more and more problems occur in the manufacturing process of the DRAM, such as short circuit caused by by-product drop, bitline current leakage, capacitor collapse, breakage of a metal wire and a structural problem caused by an unqualified critical dimension. Such problems occurring in the manufacturing process are required to be screened out during yield testing; however, a current-leakage bitline cannot be accurately detected by an existing yield testing method, resulting in a low product yield.

SUMMARY

The embodiments of the present disclosure provide a memory detection method for detecting a current-leakage bitline, the method including: a memory including a plurality of memory cells, a plurality of discrete bitlines and a plurality of discrete wordlines, each of the bitlines being connected to several of the memory cells, each of the wordlines being connected to several of the memory cells, and each of the memory cells being connected to a respective one of the bitlines and a respective one of the wordlines; the memory further including a plurality of complementary bitlines, each of the complementary bitlines being in an opposite level phase to a respective one of the bitlines; the memory further including a plurality of sense amplifiers, each of the sense amplifiers being electrically coupled to one of the bitlines and one of the complementary bitlines, and the sense amplifier including a power line providing a low potential voltage and a power line providing a high potential voltage; writing first memory data to each of the memory cells; performing a reading operation after the first memory data is written, the reading operation including: sequentially gating all the wordlines for reading, so as to read first real data in each of the memory cells through the bitline and the sense amplifier, and prior to the reading, first gating the power line providing a low potential voltage corresponding to the bitline to lower a level of the bitline, and after the power line providing a low potential voltage is gated, waiting for a preset time and then gating the power line providing a high potential voltage corresponding to the bitline to raise a level of one of the bitline and the complementary bitline which is at a higher level; acquiring a first test result based on a difference between the first real data and the first memory data; writing second memory data to each of the memory cells, and for a same one of the memory cells, the second memory data being different from the first memory data; performing the reading operation again after the second memory data is written, so as to read second real data in each of the memory cells; acquiring a second test result based on a difference between the second real data and the second memory data; and acquiring a specific position of the current-leakage bitline based on the second test result and the first test result.

The embodiments of the present disclosure further provide a memory detection apparatus for detecting a current-leakage bitline, the apparatus including: a memory including a plurality of memory cells, a plurality of discrete bitlines and a plurality of discrete wordlines, each of the bitlines being connected to several of the memory cells, each of the wordlines being connected to several of the memory cells, and each of the memory cells being connected to a respective one of the bitlines and a respective one of the wordlines; the memory further including a plurality of complementary bitlines, each of the complementary bitlines being in an opposite level phase to a respective one of the bitlines; the memory further including a plurality of sense amplifiers, each of the sense amplifiers being electrically coupled to one of the bitlines and one of the complementary bitlines, and the sense amplifier including a power line providing a low potential voltage and a power line providing a high potential voltage; a writing apparatus configured to write memory data to the memory cell; a reading apparatus, the reading apparatus being configured to sequentially gate all the wordlines for reading, so as to read real data in each of the memory cells through the bitline and the sense amplifier; an instruction apparatus configured to control and gate the power line providing a low potential voltage corresponding to the bitline to lower a level of the bitline, and after gating the power line providing a low potential voltage, wait for a preset time and then gate the power line providing a high potential voltage to raise a level of one of the bitline and the complementary bitline which is at a higher level; and an error reporting apparatus, the error reporting apparatus acquiring a test result based on a difference between the real data and the memory data, and acquiring a specific position of the current-leakage bitline based on the test result.

BRIEF DESCRIPTION OF DRAWINGS

One or more embodiments are exemplarily described by using figures that are corresponding thereto in the accompanying drawings; the exemplary descriptions do not constitute limitations on the embodiments. Elements with same reference numerals in the accompanying drawings are similar elements. Unless otherwise particularly stated, the figures in the accompanying drawings do not constitute a scale limitation.

DESCRIPTION OF EMBODIMENTS

Figure 1:
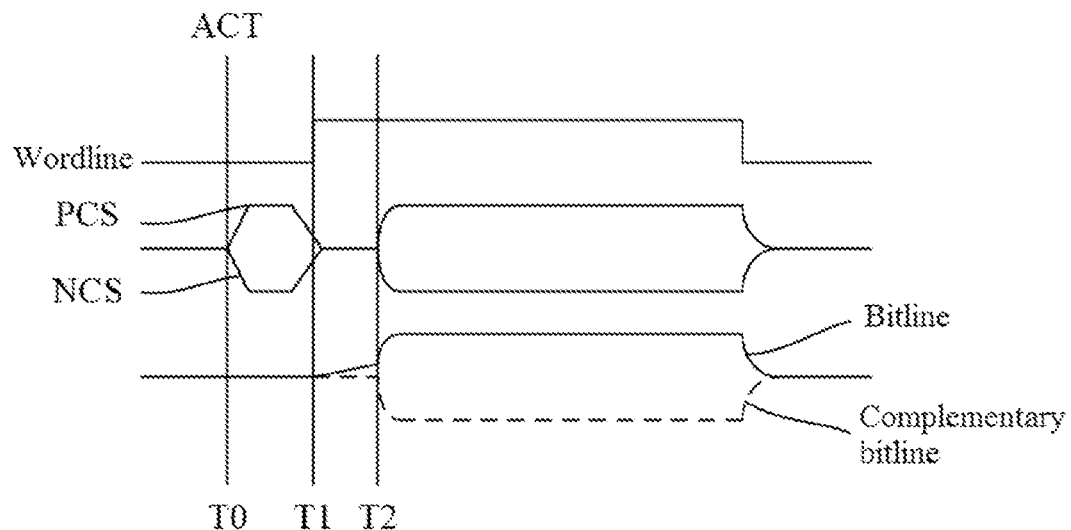
FIG. 1 is a schematic diagram of level variations of a bitline in a memory detection method.

It can be known from the Background that the memory detection method in the prior art has low accuracy.

Analysis is provided now in combination with a memory detection method. The detection method includes: a memory including several memory cells; writing first memory data to each memory cell; performing a reading operation after the first memory data is written, the reading operation including: sequentially gating all wordlines for reading, so as to read first real data in each memory cell through a bitline and a sense amplifier, and prior to the reading, simultaneously gating a power line NCS providing a low potential voltage corresponding to the bitline and a power line PCS providing a high potential voltage corresponding to the bitline to raise a level of one of the bitline and a complementary bitline which is at a higher level; acquiring a first test result based on a difference between the first real data and the first memory data; writing second memory data to each memory cell, and for a same memory cell, the second memory data being different from the first memory data; performing the reading operation again after the second memory data is written, so as to read second real data in each memory cell; acquiring a second test result based on a difference between the second real data and the second memory data; and acquiring a specific position of a current-leakage bitline based on the second test result and the first test result.

When the bitline is short-circuited with the wordline, the following four situations may occur during the detection. In a first situation, the bitline is at a low level; when the bitline is short-circuited with a gated wordline, the bitline is changed to a high level, and a reading result is a high level of the bitline, which is inconsistent with an actual situation; a defect is confirmed, so that the specific position of the current-leakage bitline is detected. In a second situation, the bitline is at a high level; when the bitline is short-circuited with a gated wordline, the bitline is still at a high level, and a reading result is a high level of the bitline, which is consistent with an actual situation; no defect can be obtained, and the specific position of the current-leakage bitline cannot be detected. In a third situation, the bitline is at a low level; when the bitline is short-circuited with a non-gated wordline, the bitline is still at a low level, and a reading result is a low level of the bitline, which is consistent with an actual situation; no defect can be obtained, and the specific position of the current-leakage bitline cannot be detected. In a fourth situation, the bitline is at a high level; when the bitline is short-circuited with a non-gated wordline, the bitline is changed to a low level, and a reading result is a low level of the bitline, which is inconsistent with an actual situation; a defect is confirmed, so that the specific position of the current-leakage bitline is detected.

No defect can be obtained in the second situation and the third situation; however, the second situation can be changed to the fourth situation and the third situation can be changed to the first situation by sequentially gating all the wordlines. In this way, current leakage of the bitline caused by short circuit between the bitline and the wordline can be accurately detected, but current leakage of the bitline caused by incomplete short circuit between the bitline and the wordline cannot be detected.

FIG. 1 is a schematic diagram of level variations of a bitline in a memory detection method.

Referring to FIG. 1, the bitline is at a high level. When the bitline is incompletely short-circuited with a gated wordline, an activation operation ACT is performed at a time node T0. After the activation operation ACT, a power line NCS providing a low potential voltage and a power line PCS providing a high potential voltage are precharged. After the precharging, the power line NCS providing a low potential voltage is at a same level as the power line PCS providing a high potential voltage. A gated bitline and a corresponding complementary bitline enter a charge sharing stage, the bitline and the corresponding complementary bitline are precharged, and the bitline and the corresponding complementary bitline after the precharging are at a same level. A wordline is gated at a time node T1. Within a time period from T1 to T2, the level of the complementary bitline does not change, but the level of the bitline slowly rises since the bitline is at a high level. At a time node T2, a sense amplifier is turned on, the power line NCS providing a low potential voltage and the power line PCS providing a high potential voltage that correspond to the bitline are simultaneously gated, the bitline is still at a high level, and a reading result is a high level of the bitline, which is consistent with an actual situation; no defect can be obtained, and the specific position of the current-leakage bitline cannot be detected. If another wordline is gated, the bitline is at a high level, the bitline is incompletely short-circuited with a non-gated wordline, the bitline is still at a high level, and a reading result is a high level of the bitline, which is consistent with an actual situation; no defect can be obtained, and the specific position of the current-leakage bitline cannot be detected. It can be obtained that current leakage of the bitline caused by incomplete short circuit between the bitline and the wordline cannot be detected by the memory detection method, leading to incomplete detection on the current leakage of the bitline and affecting a product yield.

An embodiment of the present disclosure provides a memory detection method. A preset time is added between the gated power line providing a low potential voltage and the gated power line providing a high potential voltage. Within a preset time period, since the power line providing a low potential voltage has been gated, if the gated bitline is at a high level and current leakage occurs, the level of the bitline is reducible; then, in the preset time period, the current-leakage bitline may be reduced from a high level to a low level. In this way, the first real data read out after amplification by the sense amplifier is different from the first memory data, and an exact position of the current-leakage bitline can be determined. All the wordlines and bitlines are sequentially gated with the method, the second memory data different from the first memory data is written to the memory cell, the second real data is read, and an accurate position of the current-leakage bitline can be obtained without omission according to two comparison results, which improves the accuracy of the memory detection method and improves a product yield.

In order to make the objectives, technical solutions and advantages of the embodiments of the present disclosure clearer, various embodiments of the present disclosure will be described below in detail with reference to the drawings.

However, those of ordinary skill in the art may understand that, in the embodiments of the present disclosure, numerous technical details are set forth in order to enable a reader to better understand the present disclosure. However, the technical solutions claimed in the present disclosure can be implemented without these technical details and various changes and modifications based on the embodiments below.

Figure 2:
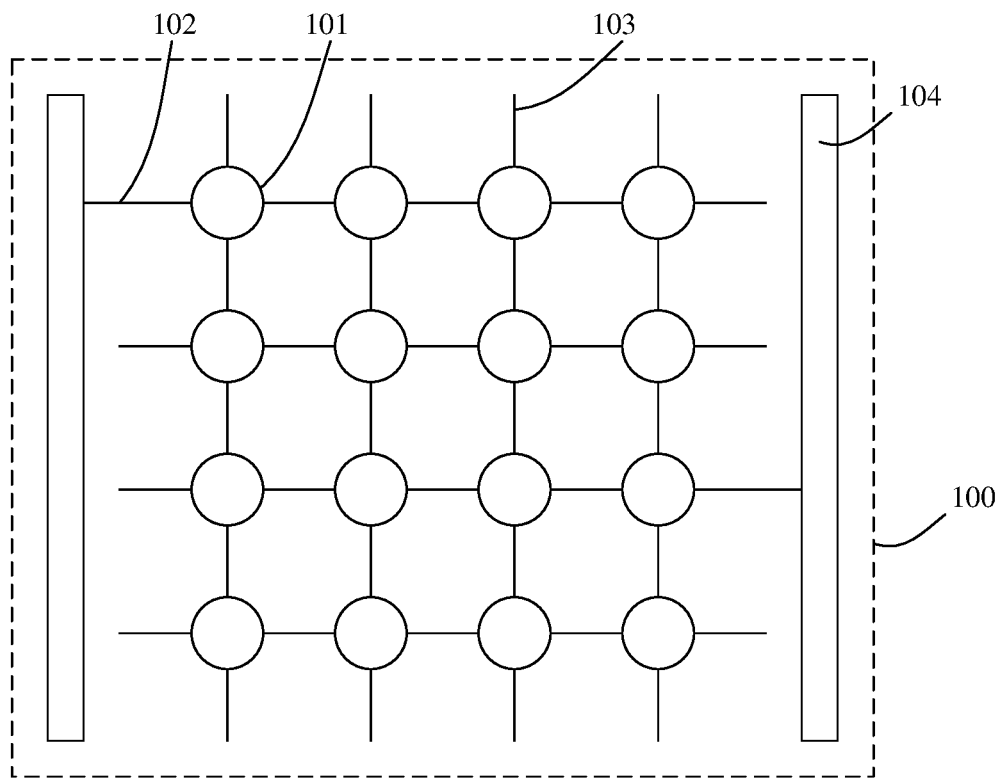
FIG. 2 is a schematic structural diagram of a memory according to an embodiment of the present disclosure.

FIG. 2 is a schematic structural diagram of a memory according to an embodiment of the present disclosure.

An embodiment of the present disclosure provides a memory detection method for detecting a current-leakage bitline, referring to FIG. 2, a memory 100 including a plurality of memory cells 101, a plurality of discrete bitlines 102 and a plurality of discrete wordlines 103, each of the bitlines 102 being connected to several of the memory cells 101, each of the wordlines 103 being connected to several of the memory cells 101, and each of the memory cells 101 being connected to a respective one of the bitlines 102 and a respective one of the wordlines 103; the memory 100 further including a plurality of complementary bitlines (not marked), each of the complementary bitlines being in an opposite level phase to a respective one of the bitlines 102; the memory 100 further including a plurality of sense amplifiers 104, each of the sense amplifiers 104 being electrically coupled to one of the bitlines 102 and one of the complementary bitlines, and the sense amplifier 104 including a power line NCS providing a low potential voltage and a power line PCS providing a high potential voltage.

Firstly, the memory cell 101 is initialized to activate the memory cell 101. After the initialization, a writing operation is performed, and first memory data is written to each memory cell 101. In the present embodiment, the first memory data is written to the plurality of memory cells 101 by writing same first memory data to all the memory cells 101.

In other embodiments, the first memory data is written to the memory cell by writing same first memory data to several of the memory cells connected to a same wordline and writing different first memory data to several of the memory cells connected to adjacent wordlines at the same time.

In other embodiments, the first memory data is written to the memory cell further by taking each two adjacent wordlines as a group, writing same first memory data to several of the memory cells connected to a same group of wordlines, and at the same time, writing different first memory data to several of the memory cells connected to an adjacent group of wordlines.

In the present embodiment, after the first memory data is written to the memory cell 101, all the memory cells 101 may also be automatically refreshed. Then, a reading operation is performed. The reading operation includes: sequentially gating all wordlines 103 for reading, so as to read first real data in each memory cell 101 through the bitline 102 and the sense amplifier; acquiring a first test result based on a difference between the first real data and the first memory data; then, writing second memory data to each memory cell 101, and for a same memory cell 101, the second memory data being different from the first memory data; performing the reading operation again after the second memory data is written, so as to read second real data in each memory cell 101; acquiring a second test result based on a difference between the second real data and the second memory data; and acquiring a specific position of the current-leakage bitline 102 based on the second test result and the first test result.

In the present embodiment, the second memory data is written to the plurality of memory cells 101 by writing same second memory data to all the memory cells 101.

In other embodiments, the second memory data is written to the memory cell by writing same second memory data to several of the memory cells connected to a same wordline and writing different second memory data to several of the memory cells connected to adjacent wordlines at the same time.

In other embodiments, the second memory data is written to the memory cell further by taking each two adjacent wordlines as a group, writing same second memory data to several of the memory cells connected to a same group of wordlines, and at the same time, writing different second memory data to several of the memory cells connected to an adjacent group of wordlines.

In the present embodiment, prior to the reading, the power line NCS providing a low potential voltage corresponding to the bitline 102 is first gated to lower a level of the bitline 102, and after the power line NCS providing a low potential voltage is gated, a preset time is waited and then the power line PCS providing a high potential voltage corresponding to the bitline 102 is gated to raise a level of one of the bitline 102 and the complementary bitline which is at a higher level. Then, all the memory cells 101 may also be automatically refreshed. Level variations of the bitline 102 under various conditions during the detection are described in detail below with reference to the accompanying drawings.

Figure 3:
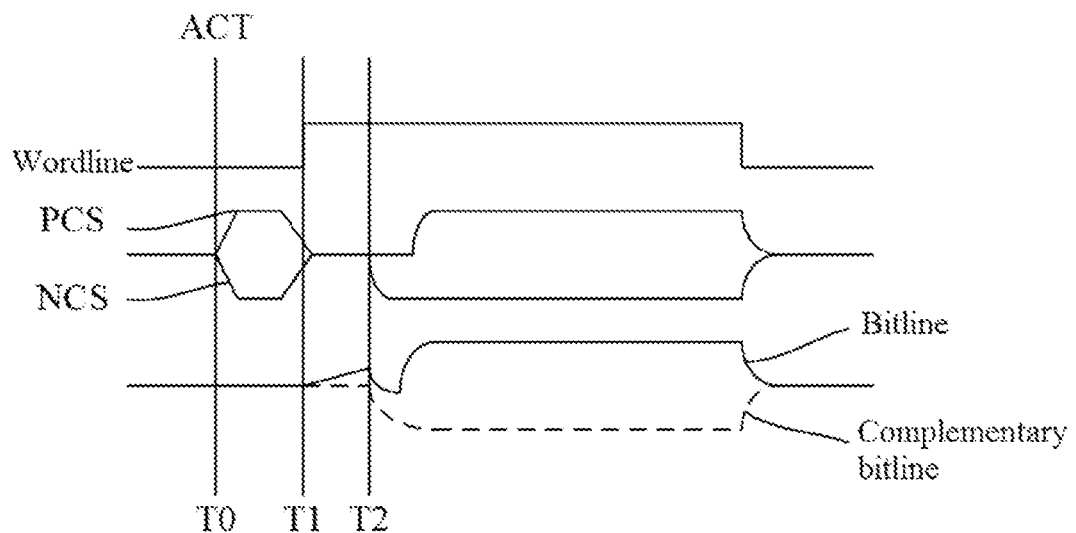
FIG. 3 is a schematic diagram of level variations of a bitline according to a first embodiment of the present disclosure.

FIG. 3 is a schematic diagram of level variations of a bitline according to a first embodiment of the present disclosure.

Referring to FIG. 3, when the gated bitline 102 is at a high level and no current leakage occurs, the activation operation ACT is performed at the time node T0. After the activation operation ACT, the power line NCS providing a low potential voltage and the power line PCS providing a high potential voltage are precharged. After the precharging, the power line NCS providing a low potential voltage is at a same level as the power line PCS providing a high potential voltage. A gated bitline 102 and a corresponding complementary bitline enter a charge sharing stage, the bitline 102 and the corresponding complementary bitline are precharged, and the bitline 102 and the corresponding complementary bitline after the precharging are at a same level. Any wordline 103 is gated at the time node T1. Within the time period from T1 to T2, the level of the complementary bitline does not change, but the level of the bitline 102 slowly rises since the bitline 102 is at a high level. At the time node T2, a sense amplifier is turned on, and the power line NCS providing a low potential voltage corresponding to the bitline 102 is gated; in this case, the levels of the bitline 102 and the complementary bitline are reduced. After a preset time is waited, the power line PCS providing a high potential voltage corresponding to the bitline 102 is gated, so as to raise a level of one of the bitline 102 and the corresponding complementary bitline which is at a higher level. The bitline 102 is at a high level, the complementary bitline is at a low level, and after the bitline 102 and the corresponding complementary bitline are reduced for the preset time at a same reduction rate, and the level of the bitline 102 is still higher than that of the complementary bitline; therefore, the level of the bitline 102 is raised after the power line PCS is gated.

In this way, the reading result is a high level of the bitline, which is consistent with the actual situation. A bitline 102 without current leakage may not be misjudged by the memory detection method according to the present embodiment.

The following is a detailed description of a situation where the bitline 102 is completely short-circuited with the wordline 103. A part the same as that when the bitline 102 has no current leakage is not described in detail.

The bitline 102 is at a low level; when the bitline 102 is short-circuited with a gated wordline 103, the bitline 102 is changed to a high level. Within the preset time, the high level of the complementary bitline is reducible, while the level of the bitline 102 is not reducible. After the preset time, the level of the bitline 102 is higher than that of the complementary bitline. A reading result is a high level of the bitline 102, which is inconsistent with an actual situation. A defect is confirmed, and the specific position of the current-leakage bitline 102 is detected. The bitline 102 is at a high level; when the bitline 102 is short-circuited with the gated wordline 103, the bitline 102 is still at a high level. Within the preset time, the low level of the complementary bitline is reducible, while the high level of the bitline 102 is not reducible. After the preset time, the level of the bitline 102 is higher than that of the complementary bitline. A reading result is a high level of the bitline 102, which is consistent with the actual situation. No defect can be obtained, and the specific position of the current-leakage bitline 102 cannot be detected. If the bitline 102 is at a low level, when the bitline 102 is short-circuited with a non-gated wordline 103, the bitline 102 is still at a low level. Within the preset time, the high level of the complementary bitline is reducible, and the low level of the bitline 102 is reducible. After the preset time, the level of the bitline 102 is lower than that of the complementary bitline. A reading result is a low level of the bitline 102, which is consistent with the actual situation. No defect can be obtained, and the specific position of the current-leakage bitline 102 cannot be detected. If the bitline 102 is at a high level, when the bitline 102 is short-circuited with the non-gated wordline 103, the bitline 102 is changed to a low level. Within the preset time, the low level of the complementary bitline is reducible, and the low level of the bitline 102 is also reducible. After the preset time, the level of the bitline 102 is lower than that of the complementary bitline. A reading result is a low level of the bitline 102, which is inconsistent with the actual situation. A defect is confirmed, and the specific position of the current-leakage bitline 102 is detected.

No defect can be obtained from the situation where the high-level bitline 102 is short-circuited with the gated wordline 103 and the situation where the low-level bitline 102 is short-circuited with the non-gated wordline 103. However, by sequentially gating all the wordlines, the situation where the high-level bitline 102 is short-circuited with the gated wordline 103 can be changed to a situation where the high-level bitline 102 is short-circuited with the non-gated wordline 103, and the situation where the low-level bitline 102 is short-circuited with the non-gated wordline 103 can be changed to a situation where the low-level bitline 102 is short-circuited with the gated wordline 103. In this way, current leakage of the bitline 102 caused by complete short circuit between the bitline 102 and the wordline 103 can be accurately detected.

The following is a detailed description of a situation where incomplete short circuit between the bitline 102 and the wordline 103 leads to current leakage of the bitline. A part the same as that when the bitline 102 has no current leakage is not described in detail.

Figure 4:
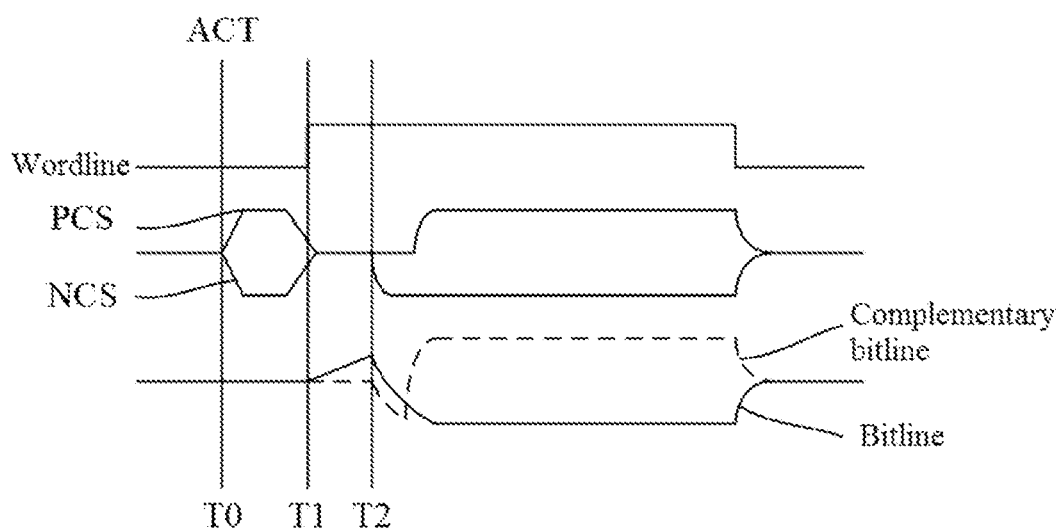
FIG. 4 is a schematic diagram of level variations of another bitline according to the first embodiment of the present disclosure.

FIG. 4 is a schematic diagram of level variations of another bitline according to the first embodiment of the present disclosure.

Referring to FIG. 4, the bitline 102 is at a high level; when the bitline 102 is incompletely short-circuited with the gated wordline 103, the activation operation ACT is performed at the time node T0. After the activation operation ACT, the power line NCS providing a low potential voltage and the power line PCS providing a high potential voltage are precharged. After the precharging, the power line NCS providing a low potential voltage is at a same level as the power line PCS providing a high potential voltage. A gated bitline 102 and a corresponding complementary bitline enter a charge sharing stage, the bitline 102 and the corresponding complementary bitline are precharged, and the bitline 102 and the corresponding complementary bitline after the precharging are at a same level. A wordline 103 is gated at the time node T1. Within the time period from T1 to T2, the level of the complementary bitline does not change, but the level of the bitline 102 slowly rises since the bitline 102 is at a high level. At the time node T2, a sense amplifier is turned on, and the power line NCS providing a low potential voltage corresponding to the bitline 102 is gated; in this case, the levels of the bitline 102 and the complementary bitline are reduced. After the preset time is waited, the power line PCS providing a high potential voltage corresponding to the bitline 102 is gated, so as to raise a level of one of the bitline 102 and the corresponding complementary bitline which is at a higher level. The bitline 102 is at a high level, and the complementary bitline is at a low level; however, since the bitline 102 has current leakage and the wordline 103 incompletely short-circuited cannot provide the bitline 102 with a level, the level of the bitline 102 is reduced at a higher rate than the level of the complementary bitline. After the preset time, the level of the bitline 102 is lower than that of the complementary bitline; therefore, after the power line PCS is gated, the level of the complementary bitline is raised. A reading result is a low level of the bitline 102, which is inconsistent with the actual situation. A defect is confirmed, and the specific position of the current-leakage bitline 102 is detected.

In three situations, that is, the low-level bitline 102 is incompletely short-circuited with the non-gated wordline 103, the high-level bitline 102 is incompletely short-circuited with the non-gated wordline 103 and the low-level bitline 102 is incompletely short-circuited with the gated wordline 103, the three situations can be converted to a situation where the high-level bitline 102 is incompletely short-circuited with the gated wordline 103 to lead to current leakage by sequentially gating other wordlines 103 and writing second memory data different from the first memory data to each memory cell 101 in a second detection, so that the specific position of the current-leakage bitline 102 can be detected more comprehensively and accurately, and a yield of the memory 100 can be improved.

In the present embodiment, the present time is 90 ns to 120 ns, which may be specifically 95 ns, 100 ns or 110 ns. When the preset time is within the time period, it can ensure that more current-leakage bitlines 102 can be detected.

Figure 5:
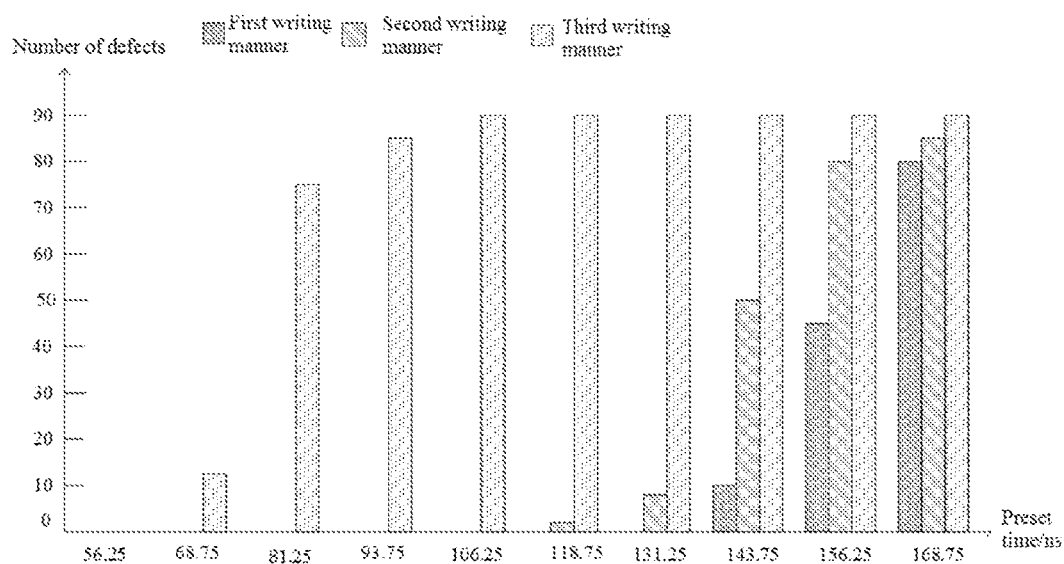
FIG. 5 is a graph of effects of a memory detection method according to the embodiment of the present disclosure.

FIG. 5 is a graph of effects of a memory detection method according to an embodiment of the present disclosure.

Referring to FIG. 5, in a first writing manner, memory data written to all the memory cells are the same. In a second writing manner, same memory data is written to several memory cells connected to a same wordline, and at the same time, different memory data is written to several memory cells connected to adjacent wordlines. In a third writing manner, taking each two adjacent wordlines as a group, same memory data is written to several memory cells connected to a same group of wordlines, and at the same time, different memory data is written to several memory cells connected to an adjacent group of wordlines.

It can be obtained that when the memory data is written to the memory cell 101 in the third writing manner, the detection effect is the best. The longer the preset time, the better the detection effect. For the third writing manner, the detection effect does not change after the preset time is greater than 90 ns.

In the memory detection method according to the present embodiment, prior to the reading, the power line NCS providing a low potential voltage corresponding to the bitline 102 is first gated to lower a level of the bitline 102, and after the power line NCS providing a low potential voltage is gated, a preset time is waited and then the power line PCS providing a high potential voltage corresponding to the bitline 102 is gated to raise a level of one of the bitline 102 and the complementary bitline which is at a higher level. A preset time is added between the gated power line NCS providing a low potential voltage and the gated power line PCS providing a high potential voltage. Within a preset time period, since the power line NCS providing a low potential voltage has been gated, if the gated bitline 102 is at a high level and current leakage occurs, the level of the bitline 102 is reducible; then, in the preset time period, the current-leakage bitline 102 may be reduced from a high level to a low level. In this way, real data read out after amplification by the sense amplifier is different from memory data, and an exact position of the current-leakage bitline 102 can be determined. All the wordlines 103 and bitlines 102 are sequentially gated with the method, different memory data is written to the memory cell 101 twice, the real data is read twice, and an accurate position of the current-leakage bitline 102 can be obtained without omission according to two comparison results, which improves the accuracy of the detection method of the memory 100 and improves a product yield.

A second embodiment of the present disclosure provides a memory detection apparatus corresponding to the memory detection method according to the first embodiment, for detecting a current-leakage bitline. The memory detection apparatus according to the present embodiment is described in detail below with reference to the accompanying drawings.

Referring to FIG. 2, a memory 100 includes a plurality of memory cells 101, a plurality of discrete bitlines 102 and a plurality of discrete wordlines 103, each of the bitlines 102 is connected to several of the memory cells 101, each of the wordlines 103 is connected to several of the memory cells 101, and each of the memory cells 101 is connected to a respective one of the bitlines 102 and a respective one of the wordlines 103. The memory 100 further includes a plurality of complementary bitlines (not marked), and each of the complementary bitlines is in an opposite level phase to a respective one of the bitlines 102. The memory 100 further includes a plurality of sense amplifiers 104, each of the sense amplifiers 104 is electrically coupled to one of the bitlines 102 and one of the complementary bitlines, and the sense amplifier 104 includes a power line NCS providing a low potential voltage and a power line PCS providing a high potential voltage.

Figure 6:
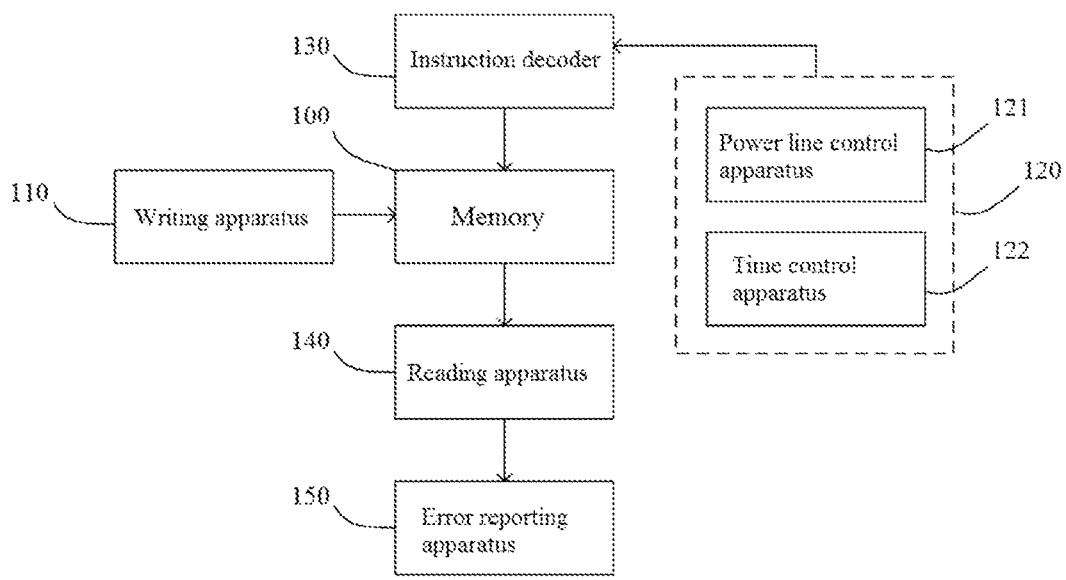
FIG. 6 is a schematic modular diagram of a memory detection apparatus according to a second embodiment of the present disclosure.

FIG. 6 is a schematic modular diagram of a memory detection apparatus according to a second embodiment of the present disclosure.

A writing apparatus 110 is configured to write memory data to the memory cell 101. An instruction apparatus 120 includes a power line control apparatus 121. The power line control apparatus 121 is configured to control and gate the power line NCS providing a low potential voltage corresponding to the bitline to lower a level of the bitline 102, and after gating the power line NCS providing a low potential voltage, wait for a preset time and then gate the power line PCS providing a high potential voltage to raise a level of one of the bitline 102 and the complementary bitline which is at a higher level. The instruction apparatus 120 further includes a time control apparatus 122. The time control apparatus 122 is configured to control a duration of the preset time.

In the present embodiment, the present time is 90 ns to 120 ns, which may be specifically 95 ns, 100 ns or 110 ns. When the preset time is within the time period, it can ensure that more current-leakage bitlines 102 can be detected.

In the present embodiment, the apparatus further includes: a precharging apparatus, the precharging apparatus being configured to precharge the bitline 102 and a respective one of the complementary bitlines, so that, after one of the wordlines 103 is gated, the bitline 102 is at a same level as a respective one of the complementary bitlines; and further includes: an automatic refreshing apparatus configured to automatically refresh the memory cell 101 regularly.

In the present embodiment, the apparatus further includes: an instruction decoder 130 configured to gate, according to an instruction sent by the instruction apparatus 120, the power line NCS providing a low potential voltage and the power line PCS providing a high voltage potential.

In the present embodiment, a reading apparatus 140 is configured to sequentially gate all the wordlines 103 for reading, so as to read real data in each of the memory cells 101 through the bitline 102 and the sense amplifier 104. An error reporting apparatus 150 acquires a test result based on a difference between the real data and the memory data, and acquires a specific position of the current-leakage bitline based on the test result.

In the memory detection apparatus according to the present embodiment, prior to the reading, the instruction apparatus 120 controls first gating of the power line NCS providing a low potential voltage corresponding to the bitline 102 to lower a level of the bitline 102; after the power line NCS providing a low potential voltage is gated, the time control apparatus 122 controls a wait for a preset time and then gates the power line PCS providing a high potential voltage corresponding to the bitline 102 to raise a level of one of the bitline 102 and the complementary bitline which is at a higher level. Within a preset time period, since the power line NCS providing a low potential voltage has been gated, if the gated bitline 102 is at a high level and current leakage occurs, the level of the bitline 102 is reducible; then, in the preset time period, the current-leakage bitline 102 may be reduced from a high level to a low level. In this way, real data read out after amplification by the sense amplifier 104 is different from memory data, and an exact position of the current-leakage bitline 102 can be determined, which improves the accuracy of the detection method of the memory 100 and improves a product yield.

In addition, the bitline and the corresponding complementary bitline are precharged, and the bitline and the corresponding complementary bitline after the precharging are at a same level, which prevents the influence of other factors on one of the bitline and the corresponding complementary bitline, which is at a higher level, selected by the sense amplifier, ensures that the detected potential completely reflects a state of the memory, and is conducive to improving the accuracy of detection.

Those of ordinary skill in the art may understand that the above implementations are specific embodiments for implementing the present disclosure. However, in practical disclosures, various changes in forms and details may be made thereto without departing from the spirit and scope of the present disclosure. Any person skilled in the art can make respective changes and modifications without departing from the spirit and scope of the present disclosure. Therefore, the protection scope of the present disclosure should be subject to the scope defined by the claims.

What is claimed is:

1. A memory detection method, for detecting a current-leakage bitline, the method comprising:
   a memory comprising a plurality of memory cells, a plurality of discrete bitlines and a plurality of discrete wordlines, each of the bitlines being connected to several of the memory cells, each of the wordlines being connected to several of the memory cells, and each of the memory cells being connected to a respective one of the bitlines and a respective one of the wordlines; the memory further comprising a plurality of complementary bitlines, each of the complementary bitlines being in an opposite level phase to a respective one of the bitlines; the memory further comprising a plurality of sense amplifiers, each of the sense amplifiers being electrically coupled to one of the bitlines and one of the complementary bitlines, and the sense amplifier comprising a power line providing a low potential voltage and a power line providing a high potential voltage;
   writing first memory data to each of the memory cells;
   performing a reading operation after the first memory data is written, the reading operation comprising: sequentially gating all the wordlines for reading, so as to read first real data in each of the memory cells through the bitline and the sense amplifier, and prior to the reading, first gating the power line providing a low potential voltage corresponding to the bitline to lower a level of the bitline, and after the power line providing a low potential voltage is gated, waiting for a preset time and then gating the power line providing a high potential voltage corresponding to the bitline to raise a level of one of the bitline and the complementary bitline which is at a higher level;
   acquiring a first test result based on a difference between the first real data and the first memory data;
   writing second memory data to each of the memory cells, and for a same one of the memory cells, the second memory data being different from the first memory data;
   performing the reading operation again after the second memory data is written, so as to read second real data in each of the memory cells;
   acquiring a second test result based on a difference between the second real data and the second memory data; and
   acquiring a specific position of the current-leakage bitline based on the second test result and the first test result.

2. The memory detection method according to claim 1, wherein the preset time is 90 ns to 120 ns.

3. The memory detection method according to claim 1, wherein the first memory data is written to the memory cell by writing the same first memory data to all the memory cells.

4. The memory detection method according to claim 3, wherein the second memory data is written to the memory cell by writing the same second memory data to all the memory cells.

5. The memory detection method according to claim 1, wherein the second memory data is written to the memory cell by writing the same second memory data to all the memory cells.

6. The memory detection method according to claim 1, wherein the first memory data is written to the memory cell by writing the same first memory data to several of the memory cells connected to the same wordline.

7. The memory detection method according to claim 6, wherein the second memory data is written to the memory cell by writing the same second memory data to several of the memory cells connected to the same wordline.

8. The memory detection method according to claim 1, wherein the second memory data is written to the memory cell by writing the same second memory data to several of the memory cells connected to the same wordline.

9. The memory detection method according to claim 8, wherein the first memory data and the second memory data are written to the memory cell by writing different first memory data to several of the memory cells connected to adjacent wordlines and writing different second memory data to several of the memory cells connected to the adjacent wordlines.

10. The memory detection method according to claim 1, prior to the step of gating the power line providing a low potential voltage, further comprising: precharging the power line providing a low potential voltage and the power line providing a high potential voltage, after the precharging, the power line providing a low potential voltage being at a same level as the power line providing a high potential voltage.

11. The memory detection method according to claim 1, after one of the wordlines is gated, further comprising: precharging the bitline and a respective one of the complementary bitlines, after the precharging, the bitline being at a same level as the respective complementary bitline.

12. The memory detection method according to claim 1, prior to the reading operation, further comprising: automatically refreshing all the memory cells.

13. The memory detection method according to claim 1, subsequent to the step of gating a power line providing a high potential voltage and prior to the step of reading first real data or second real data, further comprising: automatically refreshing all the memory cells.

14. A memory detection apparatus, for detecting a current-leakage bitline, the memory detection apparatus comprising:
   a memory comprising a plurality of memory cells, a plurality of discrete bitlines and a plurality of discrete wordlines, each of the bitlines being connected to several of the memory cells, each of the wordlines being connected to several of the memory cells, and each of the memory cells being connected to a respective one of the bitlines and a respective one of the wordlines; the memory further comprising a plurality of complementary bitlines, each of the complementary bitlines being in an opposite level phase to a respective one of the bitlines;
   the memory further comprising a plurality of sense amplifiers, each of the sense amplifiers being electrically coupled to one of the bitlines and one of the complementary bitlines, and the sense amplifier comprising a power line providing a low potential voltage and a power line providing a high potential voltage;

a writing apparatus configured to write memory data to the memory cell;

a reading apparatus, the reading apparatus being configured to sequentially gate all the wordlines for reading, so as to read real data in each of the memory cells through the bitline and the sense amplifier;

an instruction apparatus configured to control and gate the power line providing a low potential voltage corresponding to the bitline to lower a level of the bitline, and after gating the power line providing a low potential voltage, wait for a preset time and then gate the power line providing a high potential voltage to raise a level of one of the bitline and the complementary bitline which is at a higher level; and an error reporting apparatus, the error reporting apparatus acquiring a test result based on a difference between the real data and the memory data, and acquiring a specific position of the current-leakage bitline based on the test result.

15. The memory detection apparatus according to claim 14, further comprising: an instruction decoder configured to gate, according to an instruction sent by the instruction apparatus, the power line providing a low potential voltage and the power line providing a high voltage potential.

16. The memory detection apparatus according to claim 14, wherein the instruction apparatus comprises a time control apparatus, the time control apparatus being configured to control a duration of the preset time.

17. The memory detection apparatus according to claim 14, further comprising:

a precharging apparatus, the precharging apparatus being configured to precharge the bitline and a respective one of the complementary bitlines, so that, after one of the wordlines is gated, the bitline is at a same level as a respective one of the complementary bitlines.

18. The memory detection apparatus according to claim 14, further comprising: an automatic refreshing apparatus configured to automatically refresh the memory cell regularly.

* * * * *